United States Patent
Daruwalla et al.

(10) Patent No.: US 11,159,130 B2
(45) Date of Patent: Oct. 26, 2021

(54) RUGGEDNESS PROTECTION CIRCUIT

(71) Applicant: pSemi Corporation, San Diego, CA (US)

(72) Inventors: Parvez Daruwalla, San Diego, CA (US); Joseph Porter Slaton, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 16/574,036

(22) Filed: Sep. 17, 2019

(65) Prior Publication Data

US 2021/0083630 A1 Mar. 18, 2021

(51) Int. Cl.
| | |
|---|---|
| *H03F 1/52* | (2006.01) |
| *H03F 1/02* | (2006.01) |
| *H03F 3/195* | (2006.01) |
| *H03G 11/04* | (2006.01) |
| *H04B 1/16* | (2006.01) |

(52) U.S. Cl.
CPC ............ *H03F 1/523* (2013.01); *H03F 3/195* (2013.01); *H03G 11/04* (2013.01); *H04B 1/16* (2013.01); *H03F 2200/111* (2013.01); *H03F 2200/294* (2013.01); *H03F 2200/451* (2013.01)

(58) Field of Classification Search
CPC .... H03F 1/523; H03F 3/195; H03F 2200/451; H03F 2200/294; H03F 2200/111; H03G 11/04; H04B 1/16
USPC ........................................ 330/302, 277, 298
See application file for complete search history.

(56) References Cited

U.S. PATENT DOCUMENTS

| | | | |
|---|---|---|---|
| 6,804,502 B2 | 10/2004 | Burgener et al. | |
| 7,910,993 B2 | 3/2011 | Brindle et al. | |
| 8,018,285 B2* | 9/2011 | Kim | H03F 3/72 330/284 |
| 8,928,388 B2 | 1/2015 | Lu et al. | |
| 8,942,121 B2* | 1/2015 | Kamerman | H04B 1/109 370/252 |
| 10,236,921 B1* | 3/2019 | Kohlhepp | H01Q 1/246 |
| 10,348,262 B2 | 7/2019 | Lee et al. | |
| 10,461,704 B2 | 10/2019 | Khushali et al. | |
| 10,594,268 B2 | 3/2020 | Smith, Jr. | |
| 2021/0083631 A1 | 3/2021 | Daruwalla et al. | |

OTHER PUBLICATIONS

Non-Final Office Action for U.S. Appl. No. 16/743,637, filed Jan. 15, 2020 on behalf of pSemi Corporation. dated Apr. 29, 2021, 12 Pages.

* cited by examiner

*Primary Examiner* — Hieu P Nguyen
(74) *Attorney, Agent, or Firm* — Steinfl + Bruno LLP

(57) ABSTRACT

Various methods and circuital arrangements for protection of an RF amplifier are presented. According to one aspect, the RF amplifier is part of switchable RF paths that include at least one path with one or more attenuators that can be used during normal operation to define different modes of operation of the at least one path. An RF level detector monitors a level of an RF signal during operation of any one of the switchable RF paths and forces the RF signal through the at least one path with one or more attenuators while controlling the attenuators to provide an attenuation of the RF signal according to a desired level of protection at an input and/or output of the RF amplifier.

20 Claims, 14 Drawing Sheets

RUGGEDNESS PROTECTION CIRCUIT

TECHNICAL FIELD

The present application relates to amplifiers. In particular, the present application relates to ruggedness improvement circuits for amplifiers used in radio frequency (RF) applications.

BACKGROUND

FIG. 1 shows a simplified prior art circuit (100) that includes protection circuit elements (110) and (120) respectively coupled to an input and an output of an RF amplifier (105). In particular, the protection circuit (110) coupled to the input, IN, of the amplifier (105) may be used for ruggedness protection of the RF amplifier (105) by hard limiting (i.e., clipping) peak amplitudes of an RF signal, $RF_{IN}$, provided to the input, IN, of the amplifier (105). As shown in FIG. 1, a commonly used protection circuit (115) for ruggedness protection of the amplifier (105) may be a clamp circuit (115a, 115b) that comprises two (e.g., Zener or PN junction diodes or diode-connected MOSFETs) diodes, (115a) and (115b), connected in antiparallel for limiting (to a fixed level defined by the diodes) each of a positive peak amplitude and a negative peak amplitude of the input RF signal, $RF_{IN}$, to the amplifier (105). Furthermore, the protection circuit (120) coupled to the output, OUT, of the amplifier (105) may be used for protection of downstream (active) elements coupled to the output, OUT, of the amplifier (105) by limiting an amplitude (i.e., power) of an RF signal, $RF_{OUT}$, coupled to such downstream elements. As shown in FIG. 1, the protection circuit (120) may include a clamp circuit (122) that is configured to limit power at the output, OUT, of the amplifier, to a first (fixed) level via two diode connected transistors (122a) and (122b) connected in antiparallel, the first (fixed) level being defined, for example, by a threshold voltage, Vth, of the transistors (122a, 122b). In addition, the protection circuit (120) may further include a programmable attenuator (125), coupled to the output, OUT, of the amplifier (120), which can further limit the power of the RF signal, $RF_{OUT}$ according to a programmable level. Such programmable level may be in view of, for example, different gain modes of the amplifier (105) and/or integration of the amplifier (105) into different target RF systems as shown in FIG. 2A later described.

In some applications it may be desirable to provide protection circuits that can clamp voltages at the input, IN, and the output, OUT, of the amplifier (105) at different clamp levels depending on, for example, different gain modes and/or different frequencies of operation of the circuit. Furthermore, it may be desirable that such protection circuits, while maintaining an efficient protection of an amplifier or other active devices, reduce a physical area of the circuit as well as production cost by removing, for example, some of the higher cost and bulkier components of the prior art circuit shown in FIG. 1. This is the object of the teachings according to the present disclosure.

SUMMARY

The various teachings according to the present disclosure describe methods and circuits (i.e., circuital arrangements) for protection of an RF amplifiers and/or other active RF devices according to programmable clamping levels, thereby removing, for example, requirement for the fixed level clamp circuit (115a, 115b) and/or (122a, 122b) used in the prior art circuit of FIG. 1.

According to a first aspect of the present disclosure, a circuital arrangement is presented, the circuital arrangement comprising: a plurality of switchable RF paths comprising an RF amplifier and one or more switches configured to selectively provide a path of the plurality of switchable RF paths for flow of an RF signal provided at an input of the plurality of switchable RF paths to an output of the plurality of switchable RF paths through the RF amplifier; an RF level detector circuit that is selectively coupled via a first switch to the plurality of switchable RF paths, wherein the plurality of switchable RF paths comprises at least one path comprising a first attenuator, the at least one path configured to provide at least one low gain mode of operation of the circuital arrangement through the at least one path, and wherein the RF level detector circuit is configured to detect a voltage level of the RF signal through a selected path of the plurality of switchable RF paths that provides the flow of the RF signal, and if a corresponding detected voltage level is above a reference trip voltage, the RF level detector circuit is configured to generate a control signal to: i) switch the flow of the RF signal from the selected path to the at least one path if the selected path is different from the at least one path, and ii) control the first attenuator to attenuate the RF signal according to an attenuation that provides a desired level of protection of the RF amplifier, said attenuation being different from an attenuation corresponding to the at least one low gain mode of operation.

According to a second aspect of the present disclosure, a method for protecting an amplifier from higher voltage is presented, the method comprising: providing a plurality of switchable RF paths for processing an RF signal through one amplifier according to different modes of operation, the different modes of operation including a low gain mode of operation provided by at least one low gain path of the plurality of switchable RF paths, the low gain path comprising an attenuator to provide the low gain; selecting a mode of operation; based on the selecting, selecting a path of the plurality of switchable RF path for processing of the RF signal; based on the selecting, providing a flow of the RF signal through a selected path and through the amplifier; detecting a voltage level of the RF signal through the selected path; and based on the detecting, if a detected voltage level is above a reference trip voltage, then: i) switching the flow of the RF signal to the at least one low gain path if the selected path is different from the at least one path; and ii) controlling the attenuator to attenuate the RF signal according to an attenuation that provides a desired level of protection of the RF amplifier, said attenuation being larger than an attenuation corresponding to the at least one low gain mode of operation.

According to a third aspect of the present disclosure, a circuital arrangement is presented, the circuital arrangement comprising: a plurality of switchable RF paths comprising an RF amplifier and one or more switches configured to selectively provide a path of the plurality of switchable RF paths for flow of an RF signal provided at an input of the plurality of switchable RF paths to an output of the plurality of switchable RF paths through the RF amplifier; an RF level detector circuit that is selectively coupled via a first switch to the plurality of switchable RF paths, wherein the plurality of switchable RF paths comprises at least one path comprising a first attenuator, and wherein the RF level detector circuit is configured to detect a voltage level of the RF signal through the at least one path when selected, and if a corresponding detected voltage level is above a reference trip voltage, the RF level detector circuit is configured to generate a control signal to: control the first attenuator to attenuate the RF signal according to an attenuation that provides a desired level of protection of downstream circuits coupled to said at least one path, said attenuation being larger than different from an attenuation corresponding to a normal mode of operation of said at least one path.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

Like reference numbers and designations in the various drawings indicate like elements.

DETAILED DESCRIPTION

Throughout the present disclosure, embodiments and variations are described for the purpose of illustrating uses and implementations of inventive concepts of various embodiments. The illustrative description should be understood as presenting examples of the inventive concept, rather than as limiting the scope of the concept as disclosed herein.

Figure 1:
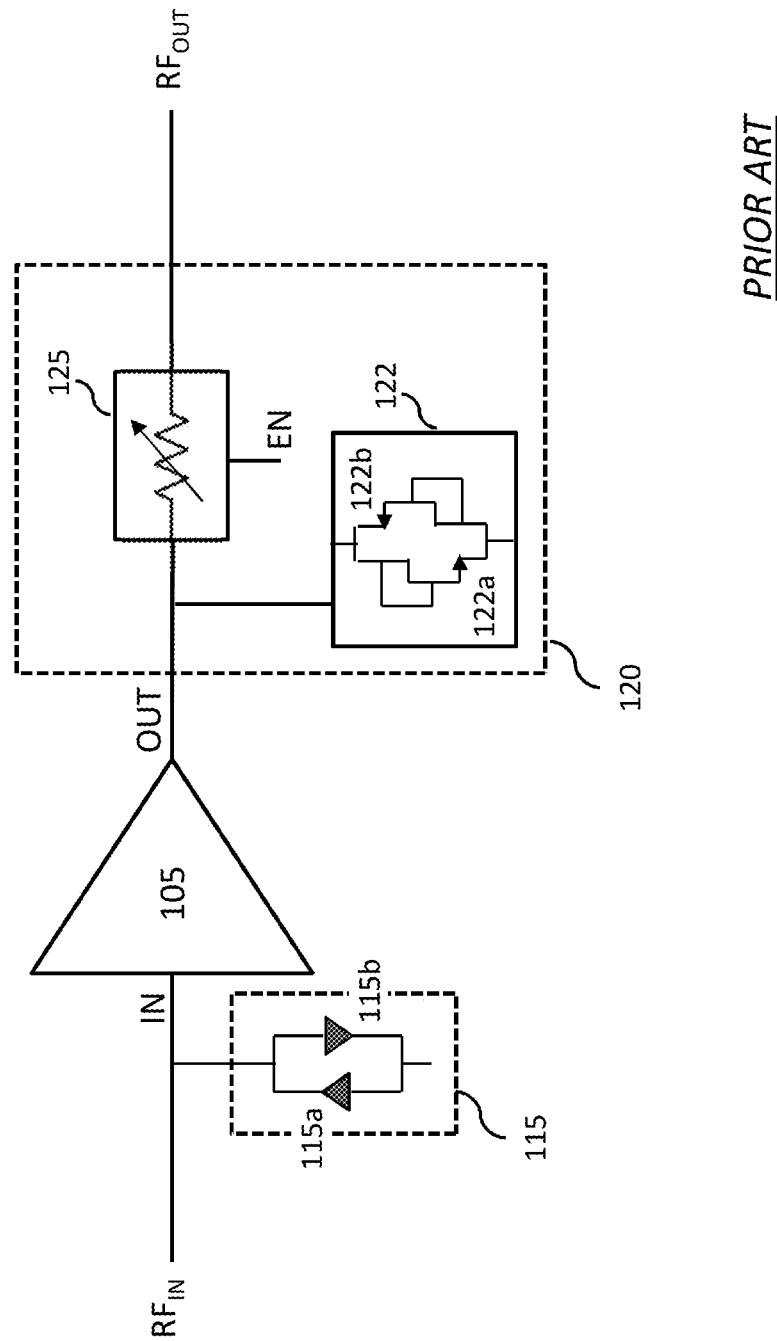
FIG. 1 shows a simplified prior art circuit that includes protection circuit elements respectively coupled to an input and an output of an RF amplifier.
Figure 2A:
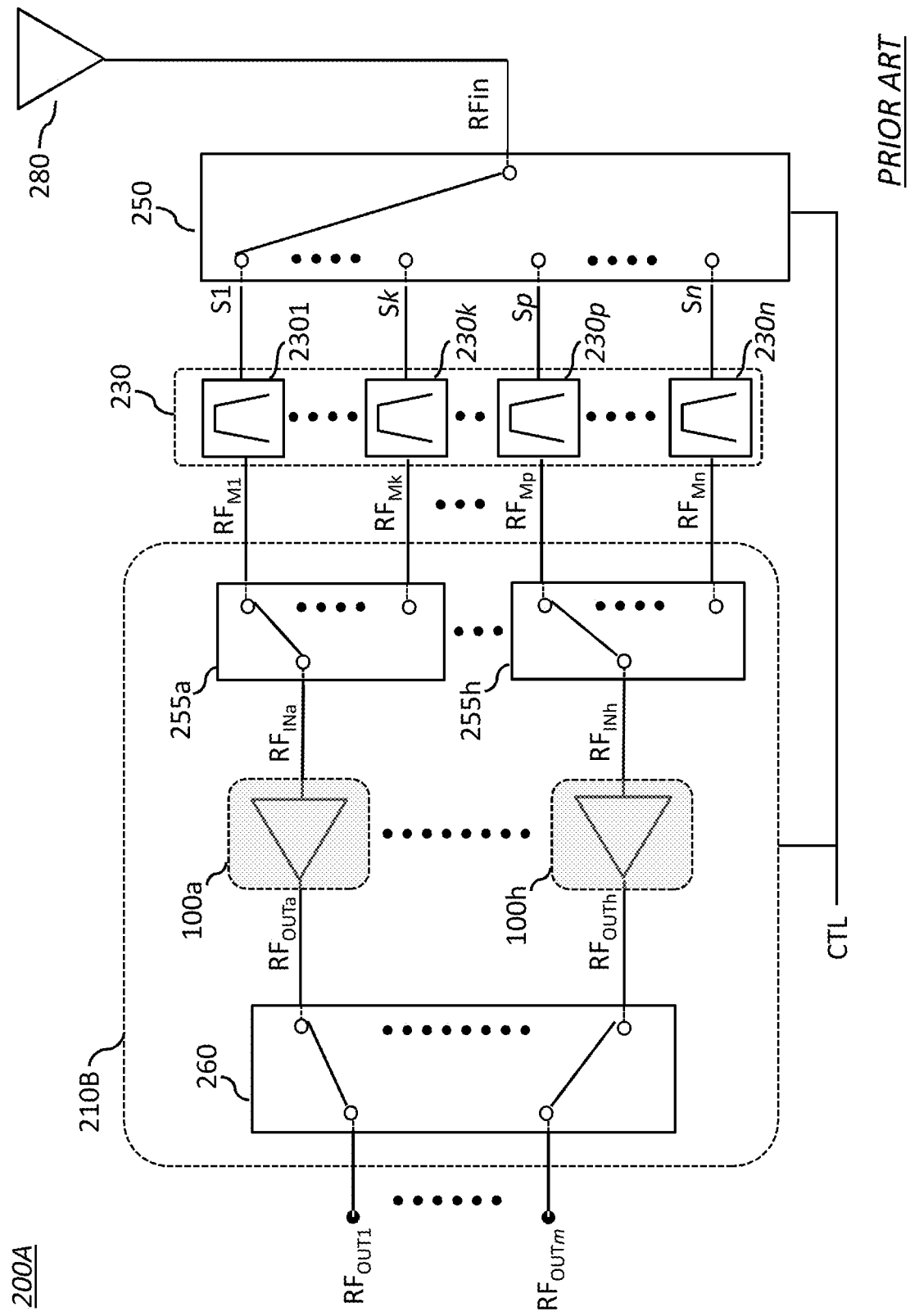
FIG. 2A shows a simplified block diagram of a prior art RF front-end stage which can be used for RF reception of multiple modes and multiple frequency bands signals via an antenna and through various low noise amplifier (LNA) circuits.

FIG. 2A shows a block diagram of an exemplary target RF system (200A) using the amplifier (105) in low noise amplifier (LNA) circuits (100a, . . . , 100h) each comprising elements similar to the elements of the circuit (100) described in FIG. 1. A person skilled in the art would recognize that FIG. 2A represents a simplified block diagram of a prior art RF front-end stage which can be used for RF reception of multiple modes and multiple frequency bands signals via an antenna (280) and through the LNA circuits (100a, . . . , 100h) according to a plurality of switchable RF paths. A person skilled in the art would realize that the block diagram depicted in FIG. 2A may also include transmit paths (not shown) coupled to antenna (280) for RF transmission of the multiple modes and multiple frequency band signals via the same antenna (280).

As can be seen in FIG. 2A, an antenna switch (250) may be used to switch an input RF signal, $RF_{IN}$, detected at the antenna, (280), to one of a plurality of selectable (i.e., switchable) RF paths, each comprising, for example, a filter (2301, . . . , 230n), wherein each of the plurality of selectable RF paths processes the detected $RF_{IN}$ signal according to a corresponding mode (e.g., gain mode) and/or band (e.g., frequency) of operation. Band input switches (255a, . . . , 255h) may be used to, for example, route filtered versions ($RF_{M1}$, . . . , $RF_{Mn}$) of the $RF_{IN}$ signal through the filters (2301, . . . , 230n) to a corresponding LNA (100a, . . . , 100h) for further processing according to, for example, a specific band and/or a specific (RF) gain mode. For example, as shown in FIG. 2A, a first band input switch (255a) may selectively couple one of a plurality of filtered RF signals ($RF_{M1}$, . . . , $RF_{Mk}$) to the LNA (100a), and a second band input switch (255h) may selectively couple one of a plurality of filtered RF signals ($RF_{Mp}$, . . . , $RF_{Mn}$) to the LNA (100h). In turn, an output RF signal (e.g., $RF_{OUTa}$, . . . , $RF_{OUTh}$) processed by each of the LNAs (100a, . . . , 100h) of the receive paths can be selectively routed for downstream processing (e.g. via a transceiver, not shown) by way of an output switch (260). In the exemplary configuration shown in FIG. 2A, the output switch (260) may effectively include one or more switches similar to the switches (255a, . . . , 255h), each selectively outputting a respective RF signal, RF$_{OUT1}$, ..., RF$_{OUTm}$, from a different group of processed RF signals through the plurality of selectable paths. Control of the antenna switch (250), the band input switches (255a, ..., 255h), and the output switch (260) through control signal, CTL, may be based on, or provided by, a controller (e.g., microcontroller, processor, microprocessor, etc.) that is aware of a selected mode and/or band of operation of the RF front-end stage (200A), such as, for example, a transceiver unit (not shown). As clearly understood by a person skilled in the art, in some exemplary configurations, elements (255a, ..., 255h, 100a, ..., 100h, 260) may be monolithically integrated as a chip and/or part of a module (210B) that is fitted into the target RF system (200A). In some cases, even the antenna switch (250) may be included in such integrated chip.

Figure 2B:
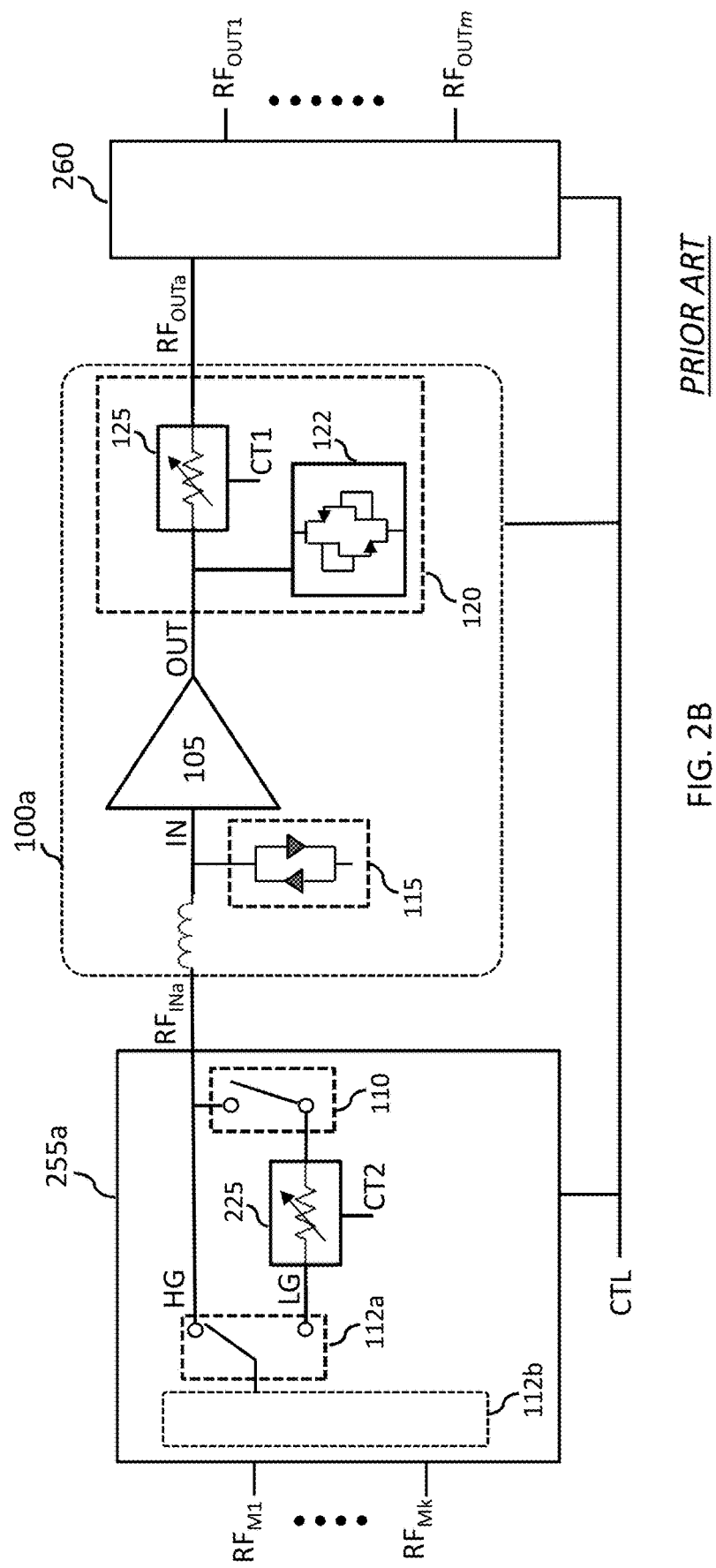
FIG. 2B shows some details of switchable RF paths through an LNA circuit of the front-end stage shown in FIG. 2A, including protection circuit elements of the LNA circuit.

FIG. 2B shows some details of switchable RF paths through the prior art LNA circuit (100a) of the front-end stage (200A) shown in FIG. 2A, including protection circuit elements (115) and (120) of the LNA circuit (100a) described above. In particular, FIG. 2B shows two switchable RF paths corresponding to two different modes of operation of the front-end stage (200A) and therefore of the LNA circuit (100a). Such modes of operation may correspond to different gain modes, such as a high gain mode through a path identified in the FIG. 2B as HG, and a low gain mode through a path identified in the FIG. 2B as LG. As shown in FIG. 2B, the band input switch (255a) may include a switching matrix (112b) that can selectively couple one of a plurality of the filtered RF signals (RF$_{M1}$, ..., RF$_{Mk}$) to a switch (112a) which in turn may selectively route the coupled filtered RF signal to the high gain mode, HG, path, or to the low gain mode, LG path, under control of the control signal, CTL. It should be noted that a person skilled in the art is well aware of various switching topologies used in the band input switches (255a, ..., 255h), as exemplified in FIG. 2B with reference to the band input switch (255a). Although for clarity purposes the switch (112a) (e.g., shown as a single-pole double-throw switch) and switching matrix (112b) are shown as separate, they may indeed be part of a same switching matrix. Furthermore, it should be noted that the switch (112a) may not be limited to the exemplary single-pole double-throw (SPDT) switch shown in FIG. 2B, as a single-pole multiple-throw (SPMT) switch may be used for switching/processing of higher number of switchable paths beyond the HG and LG paths shown in FIG. 2B.

As can be seen in FIG. 2B, during operation in the high gain mode, the HG path may take an input RF signal (e.g., one of RF$_{M1}$, ..., RF$_{Mk}$) switched through a throw of the switch (112a) and feed unattenuated as RF$_{INa}$ to the LNA circuit (100a). On the other hand, during operation in the low gain mode, the LG path may take the same input RF signal (e.g., one of RF$_{M1}$, ..., RF$_{Mk}$) switched through a different throw (not shown in FIG. 2B) of the switch (112a) and feed an attenuated version of such signal as RF$_{INa}$ to the LNA circuit (100a), wherein attenuation of the input RF signal may be provided by a known in the art attenuator circuit (225). A control signal, CTL, may selectively couple an output of the attenuator circuit (225) to the input of the LNA circuit (100a) based on the low or high gain modes of operation. It should be noted that such switching of RF paths through switches (e.g., 110) for providing different levels of attenuation to an RF signal prior to feeding the RF signal to the LNA circuit (100a) are known in the art. In particular, a person skilled in the art would know that the attenuator (225) and switch (110) may be partitioned as being part of the (band input) switch (255a) as shown in FIG. 2B, or may be partitioned as part of a separate circuit, such as, for example, as part of the LNA circuit (100a) or even a standalone circuit. Furthermore, a person skilled in the art would clearly understand that the switch (255a) may include other switchable elements not explicitly shown in FIG. 2B.

With continued reference to FIG. 2B, a person skilled in the art would know that the attenuator (225) may be programmable/adjustable/configurable to operate according to a plurality of attenuation levels, which in turn may allow configuration of the LG path according to a plurality of different low gain modes of operation, each associated to a different attenuation level of the attenuator (225). As will be described later in the present disclosure, teachings according to the present disclosure may use such configurable attenuation levels of the attenuator (225) as a protection feature to an input of the amplifier (105) that is controlled to operate as an adjustable clamp based on a detected level of an RF signal input to either the HG or the LG paths, thereby allowing removal of the fixed clamp circuit (115) used in the prior art LNA circuit (100a).

With further reference to FIG. 2B, as described above, protection of downstream circuits coupled to the output of the LNA circuit (100a) may be provided by a programmable power clamp that is based on a combination of the fixed level clamp circuit (122) and the attenuator (125) coupled at the output, OUT, of the amplifier (105). Such combination may provide a programmable clamping level (and therefore power) that is based on the fixed clamp level of the clamp circuit (122) and a programmable attenuation level of the attenuator (125). As known by a person skilled in the art, such programmable power clamp that can allow different levels of power clamp may be a required feature in some configurations. A drawback of such configuration however is that the attenuator (125) must always be included in the signal path, which therefore provides a further attenuation to the RF signal through either the HG path or the LG path beyond what is required by a corresponding gain mode. As will be described later in the present disclosure, teachings according to the present disclosure may use the configurable attenuation levels of the attenuator (125) as a protection feature coupled to the output of the amplifier (105) that is controlled to operate as a clamp based on a detected level of an RF signal input to either the HG or the LG paths, thereby allowing removal of the fixed clamp circuit (122) used in the prior art LNA circuit (100a).

Figure 3A:
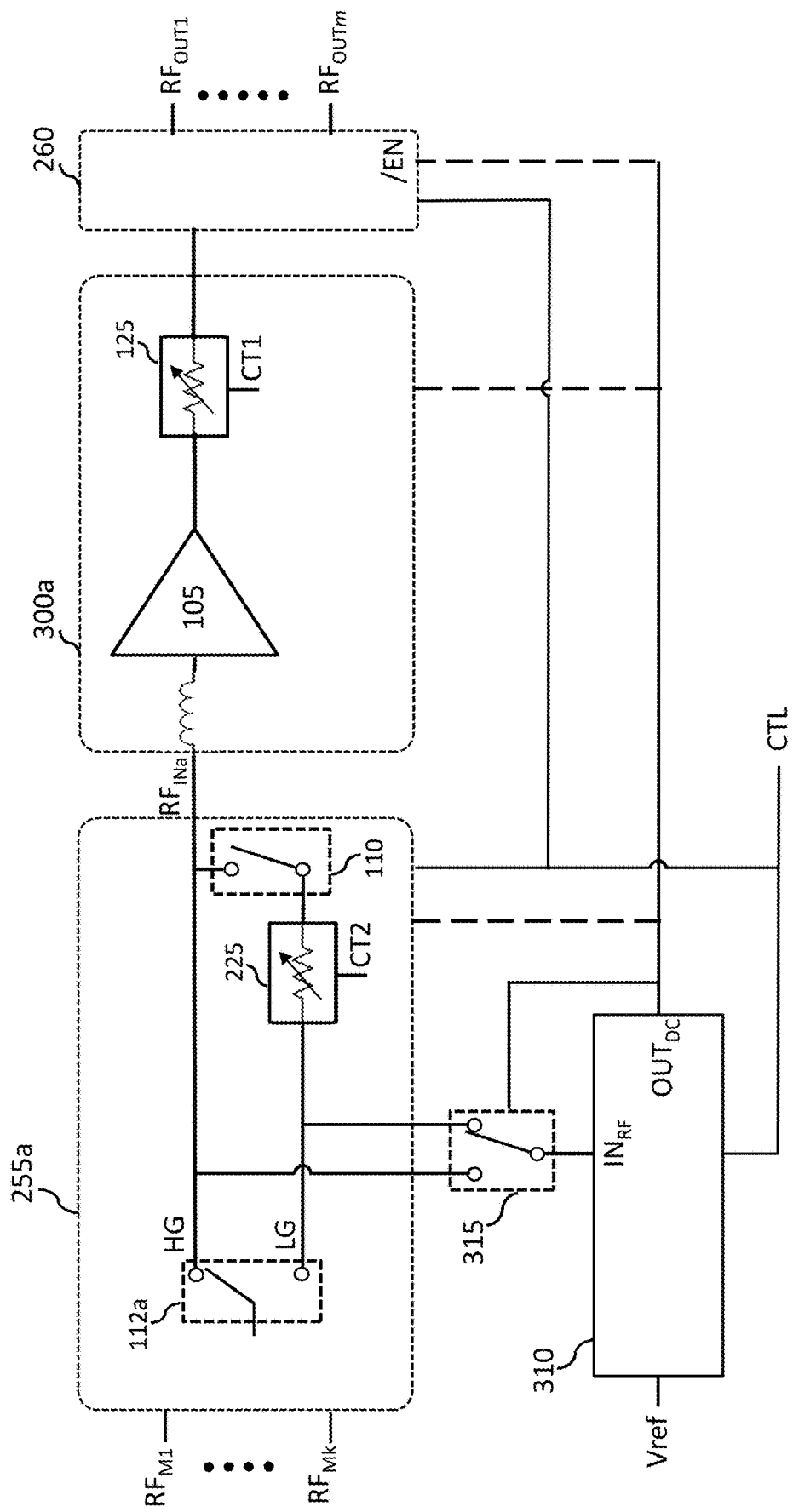
FIG. 3A shows details of switchable RF paths according to an embodiment of the present disclosure including protection circuits elements coupled to an LNA circuit, the protection circuit elements comprising a programmable RF level detector.

FIG. 3A shows details of switchable RF paths (HG, LG) according to an embodiment of the present disclosure including protection circuits elements (e.g., 110, 125, 225, 260, 310, 315) coupled to an LNA circuit (300A). Such switchable RF paths may be considered as paths of an RF front-end stage similar to one depicted in FIG. 2A. When comparing to the (HG, LG) paths of the prior art configuration described above, the two fixed level clamps (115, 122) are removed. Furthermore, the two attenuators (125) and (225) can be operated as clamps to respectively limit voltages at the output and the input of the LNA circuit (300a).

According to an embodiment of the present disclosure, control of the two attenuators (125, 225) shown in FIG. 3A, or any other of the protection circuit elements (110, 125, 225, 260), can be provided based on an RF level detected in the switchable RF paths (HG, LG) via a combination of a switch (315) and a programmable RF level detector circuit (310), wherein the switch (315) selectively couples an RF signal input to the paths (HG, LG) to an input, IN$_{RF}$, of the programmable RF level detector circuit (310). According to an exemplary embodiment of the present disclosure, as later described with reference to FIG. 4G, the attenuator (125) and/or the output switch (260) may be used as protection circuits at the output of the amplifier (105) such that upon detection of a level of the RF signal at the input, $IN_{RF}$, outside (e.g., above, larger than) a programmed level, the programmable RF level detector circuit (310) may force a further attenuation of the RF signal via the attenuator (125) and/or decouple the RF signal from downstream circuits via the output switch (260). It should be noted that in FIG. 3A, as well as FIGS. 4A-4G later described, control lines from the programmable RF level detector circuit (310, $OUT_{DC}$) to the blocks (225a, 300a, 260) that include the protection circuit elements (110, 125, 225, 260) are shown as broken lines to indicate possible control of such protection circuit elements, and are shown as solid lines when any protection element of a block is effectively controlled to operate as a protection element as a consequence of a detected high value of an RF level.

With continued reference to FIG. 3A, according to an embodiment of the present disclosure, upon detection of a level of the RF signal at the input, $IN_{RF}$, outside (e.g., above, larger than) a programmed level, the programmable RF level detector circuit (310) may force flow of the RF signal through the LG path (e.g., by controlling switch (255a) to override normal operation) and control, either directly or indirectly, one or more of the protection circuit elements (110, 125, 225, 260) to operate as protection circuits to the input of the amplifier (105) or at the output of the amplifier (105). Such direct or indirect control may be based on design choice and/or other integration factors. For example, according to some exemplary embodiments of the present disclosure, the circuit elements shown in FIG. 3A may be part of an integrated multi-gain mode and multi-band LNA module (e.g., 210B shown in FIG. 2A) controlled through an external control signal (e.g., CTL) and including some local intelligence to translate the external control signal to configurations of internal elements of such module (e.g., 210B), including of one or more of the protection circuit elements (110, 125, 225, 260, 310, 315), as well as selection/switching of the HG and LG paths as active processing paths (i.e., selective coupling of such paths to an input RF signal), including capability to override configuration dictated by the external control signal (e.g., CTL). According to other exemplary embodiments, only available intelligence may be external to the LNA module (e.g., 210B), and accordingly an external intelligence (e.g., a transceiver) may control the protection circuit elements based on an output, $OUT_{DC}$, of the programmable RF level detector circuit (310).

With further reference to FIG. 3A, according to an embodiment of the present disclosure, depending on a desired level of protection, the one or more of the protection circuit elements (110, 125, 225, 260) may be controlled based on the output, $OUT_{DC}$, of the programmable RF level detector circuit (310). For example, the attenuator (225) may be controlled to provide an adjustable level of attenuation in compliance with a desired clamping level at the input of the amplifier (105). Since the programmable RF level detector circuit (310) can detect a level or a range of the input RF signal to the paths (HG, LG), circuit (310) can establish a level of attenuation of such RF signal by the attenuator (225) to comply with the desired clamping level once the RF signal is forcibly routed though the LG path. Further protection of the input of the amplifier (105) may be provided by isolating the output of the attenuator (225) from the input of the amplifier (105) via the switch (110) (e.g., switch in OFF position as shown in FIG. 3A). On the other hand, protection at the output of the amplifier (105) may be provided by control of the attenuator (125) and/or the switch (260) in manners similar to the attenuator (225) and the switch (110). According to some exemplary embodiments of the present disclosure, the attenuators (125, 225) may be configured to shunt a programmable portion or all of the RF power to ground. It should be noted that the output, $OUT_{DC}$, of the programmable RF level detector circuit (310) may be provided via a single conductor or a plurality of conductors (signal lines) that carry control signals for controlling specific controllable elements shown in FIG. 3A, including the protection circuit elements (110, 125, 225, 260) and the switch (112a). Such control may be concurrent to the control provided by the external control signal, CTL, and in some cases overriding such external control.

With continued reference to FIG. 3A, according to an exemplary embodiment of the present disclosure, once the programmable RF level detector circuit (310) detects a level of the RF signal at the input, $IN_{RF}$, inside (e.g., below, smaller than) the programmed level, the programmable RF level detector circuit (310) may restore normal flow of the RF signal through one of the LG and HG paths according to, for example, a selected gain mode. It should be noted that the programmed level can be different for different gain modes and/or different frequencies of operation (e.g., bands) of the circuit when considering the same HG and LG paths. As previously noted, other processing paths beyond the HG and LG paths shown in FIG. 3A may be present.

Figure 3B:
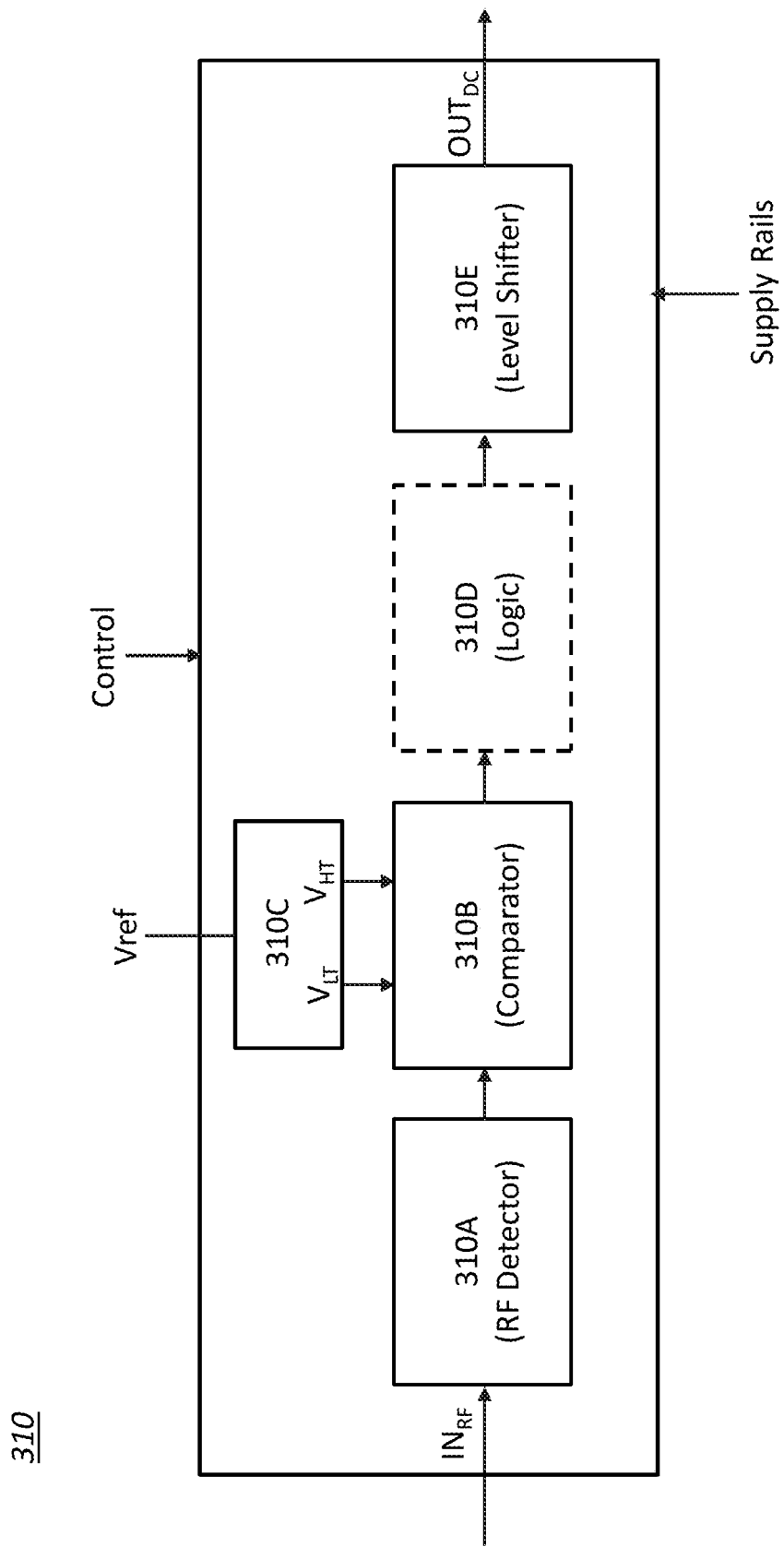
FIG. 3B shows a simplified block diagram according to an embodiment of the present disclosure of the programmable RF level detector shown in FIG. 3A.

FIG. 3B shows a simplified block diagram according to an embodiment of the present disclosure of the programmable RF level detector circuit (310) shown in FIG. 3A. As can be seen in FIG. 3B, the programmable RF level detector circuit (310) according to the present teachings comprises: i) an RF detector circuit block (310A) that is configured to generate a DC voltage corresponding to a peak amplitude of an RF signal provides at an input node, $IN_{RF}$, of the programmable RF level detector (310); ii) a comparator circuit block (310B) that is configured to compare the DC voltage output by the block (310A) to a reference high trip voltage $V_{HT}$ and a reference low trip voltage $V_{LT}$, and output a digital signal (e.g., 0 or 1) depending on a result of the comparison; iii) a trip voltage generator circuit block (310C) that is configured to programmatically generate the high and low trip voltages $V_{HT}$ and $V_{LT}$ based on input control signals (e.g., shown as Control in FIG. 3B) and a reference voltage Vref; iv) an optional control logic circuit block (310D) that is configured to receive control signals (e.g., shown as Control in FIG. 3B) or logic that may determine operation of the programmable RF level detector (310); and a level shifter circuit block (310E) that is configured to translate/shift control signal levels output by the programmable RF level detector (310) at the output node, $OUT_{DC}$. It should be noted that although the various blocks (310A, . . . , 310E) are described herein in functional terms, a person skilled in the art would know of many different specific circuit designs to implement functions of each such blocks. Applicant considers that circuit details of the blocks (310A, . . . , 310E) may be considered as design choice and therefore outside the scope of the present disclosure, although some exemplary non-limiting designs are provided in FIGS. 3C, 3D and 3E. It should be noted that for clarity reasons, various supply and reference voltages used to power the blocks shown in FIG. 3B are not shown. A person skilled in the art is well aware that such supplies exist.

With continued reference to FIG. 3B, according to a further embodiment of the present disclosure, the control signals output at the output node, $OUT_{DC}$, of the programmable RF level detector (310) may control each of the protection circuit elements (110, 125, 225, 260) in view of different detected programmable levels of RF signal. For example, for: a) levels detected between the high and low trip voltages $V_{HT}$ and $V_{LT}$, a subset of such protection circuit elements (110, 125, 225, 260) may be activated, and b) for levels above the high trip voltage $V_{HT}$, remaining of the protection circuits elements may be activated. According to some exemplary embodiments, activation between one of the two cases a) and b) may include engaging the attenuators (125, 225) at different levels of attenuation, such as, for example, a higher level of attenuation in the b) case. This can be extended to activation of one or more of the protection circuit elements (110, 125, 225, 260) according to more than two levels detected via the high and low trip voltages $V_{HT}$ and $V_{LT}$, implementation of which may be considered a mere design example.

Figure 3D:
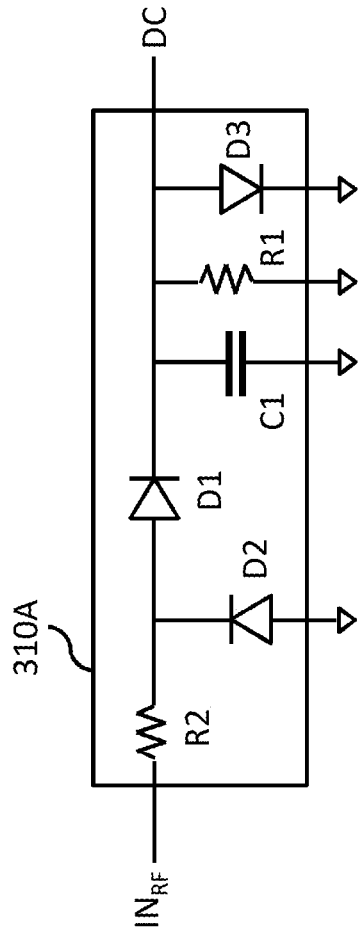
FIG. 3C and FIG. 3D show respective exemplary circuits of an RF level detector that can be used in the programmable RF level detector of FIG. 3B.
Figure 3C:
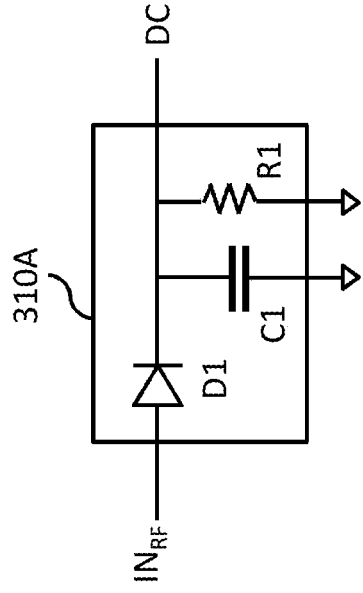

According to an embodiment of the present disclosure, the RF detector circuit block (310A) may be any known in the art RF detector circuit that can operate at frequencies of the RF signal processed through the LG and HG paths, such as, for example, circuits shown in FIG. 3C and FIG. 3D. FIG. 3C shows a well known in the art RF detector circuit that uses a series connected diode D1 at its input, followed by shunted parallel capacitor C1 and resistor R1, to provide a DC signal at the output node, DC, that has a voltage level that corresponds to a peak amplitude of the RF signal provided to the input node, $IN_{RF}$. A reduced level of loading of the RF signal by the RF detector circuit block (310A) may be obtained by using the RF detector circuit shown in FIG. 3D. A series connected resistor R2 at the input of such RF detector circuit can provide further isolation and reduced loading when compared to the circuit shown in FIG. 3C. A diode D2 coupled to the input of the RF detector circuit can further protect the circuit from RF overvoltage, whereas a diode D3 coupled at the output can limit the output DC level to protect the following block (310B). It should be noted that such exemplary circuits shown in FIG. 3C and FIG. 3D should not be considered as limiting the scope of the present application, as other RF detector circuits may be used.

Figure 3E:
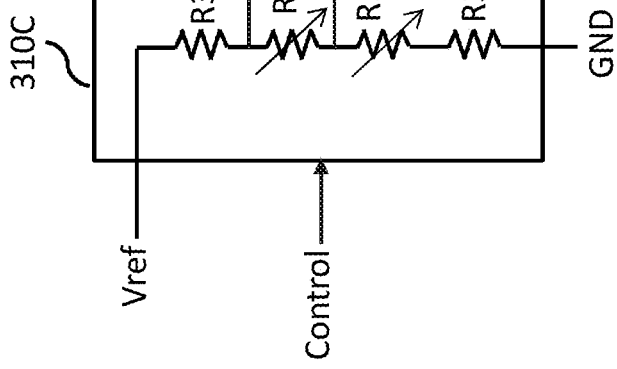
FIG. 3E shows an exemplary circuit according to an embodiment of the present disclosure for providing a reference low trip voltage and a reference high trip voltage to a comparator used in the programmable RF level detector of FIG. 3B.

FIG. 3E shows an exemplary circuit according to an embodiment of the present disclosure that can be used as the circuit block (310C) for providing the low trip voltage $V_{LT}$ and the high trip voltage $V_{HT}$ to the comparator circuit block (310B) used in the programmable RF level detector (310) of FIG. 3B. As can be seen in FIG. 3E, the trip voltages $V_{LT}$ and $V_{HT}$ are generated via a resistive ladder network (R31, . . . , R34) that includes series connected resistors R31, R32, R33 and R34, coupled between a reference voltage, Vref, and a reference ground, GND. As shown in FIG. 3E, a voltage difference between the high trip voltage $V_{HT}$ and the low trip voltage $V_{LT}$ may be provided by a voltage drop across a resistor R32, and the low trip voltage $V_{LT}$ may be provided by a ratio of sum of resistor values R33+R34 to the sum of resistor values (R31+R32+R33+R34). It should be noted that although resistors R33 and R34 are shown as separate in FIG. 3E, these may obviously be merged into one (programmable) resistor.

With further reference to FIG. 3E, according to some exemplary embodiments, one or more of the resistors, such as for example R32 and R33, can have programmable resistor values to allow control (e.g., via Control line shown in FIG. 3E, which may be, for example, the same CTL control signal of FIG. 3A) of the protection circuit elements (110, 125, 225, 260) based on different peak amplitude values of the RF signal detected by the programmable RF level detector circuit (310). In other words, teachings according to the present disclosure can provide programmable clamping levels at either input or output of an active device (e.g., amplifier 105 of FIG. 3A), wherein the programmable levels may be based on different gain modes and/or frequencies of operation of the switchable paths (e., LG, HG of FIG. 3A). It should be noted that the resistive ladder network (R31, . . . , R34) of FIG. 3E may represent one non-limiting circuit implementation for generating (programmable) values of the low and high trip voltages $V_{LT}$ and $V_{HT}$, as a person skilled in the art would know of other possible circuit implementations which may be chosen based on design goals and performances. Such other implementations may include any one or more of passive (e.g., resistors, capacitors), active (e.g., operational amplifiers) and programmable devices (A/D converters, D/A converters, memory devices).

With continued reference to FIG. 3E, according to one embodiment of the present disclosure, the reference voltage, Vref, may be generated by a voltage source having a stable voltage value that accordingly may generate a stable current through the resistive ladder network (R31, . . . , R34) and through the comparator circuit block (310B). According to one exemplary non-limiting embodiment of the present disclosure, such voltage source may be a bandgap voltage reference that generates a stable and temperature independent reference voltage, Vref, of approximately 1.25 volts. Of course, a person skilled in the art would know of the other possible implementations for such voltage source.

With reference back to the programmable RF level detector circuit (310) of FIG. 3B, the comparator circuit block (310B) may output a digital signal (e.g., digital value 0 or 1) based on a comparison of a value of a DC voltage provided to the input of the comparator circuit block (310B) by the RF detector circuit block (310A) with the low and high trip voltages $V_{LT}$ and $V_{HT}$. For example, if the DC voltage is above the high trip voltage $V_{HT}$, the comparator may output a high digital value to indicate a detected RF voltage level above the high trip voltage $V_{HT}$, and if the DC voltage is below the low trip voltage $V_{LT}$, the comparator may output a low digital value to indicate a detected RF voltage level below the low trip voltages $V_{LT}$. Furthermore, according to an embodiment of the present disclosure, the comparator may not change state/level of the output digital signal for DC voltage values between the low trip voltage $V_{LT}$ and high trip voltage $V_{HT}$. In other words, in order to prevent mistriggering of the comparator circuit block (310B) in view of possible noise or other spurious voltages present on the DC voltage, the comparator circuit block (310B) may be implemented with a hysteresis having a value that is based on a difference in voltage between the low trip voltage $V_{LT}$ and high trip voltage $V_{HT}$.

As shown in FIG. 3B, the digital signal output by the comparator circuit block (310B) may be provided to the (optional) logic circuit block (310D). The logic circuit block (310D) may combine the digital signal output by the comparator circuit block (310B) with other control signals (e.g., labelled as Control in FIG. 3B) provided to the logic circuit block (310D) in order to establish effective control of any one or more of the protection circuit elements (110, 125, 225, 260) shown in FIG. 3A. As shown in FIG. 3A, according to some exemplary embodiments, the control signals to the logic circuit block (310D) may be based on the CTL control signal described above. The effective control of the one or more of the protection circuit elements (110, 125, 225, 260) in turn may require different voltage levels which can be provided by the level shifter circuit block (310E). To this end, as shown in FIG. 3B, supply rails carrying voltage levels and references used in elements of the switchable RF paths of FIG. 3A are provided to the level shifter circuit block (310E), based on which such level shifter adjusts levels of the control signals at the output, $OUT_{DC}$, for the effective control.

As described above, any one of the of the protection circuit elements (110, 125, 225, 260) may be controlled based on the output, $OUT_{DC}$, of the programmable RF level detector circuit (310). Design choice and/or performance goals may dictate which of the one or more protection circuit elements (110, 125, 225, 260) to control. FIGS. 4B, 4C, 4D, 4E, 4F and 4G show some possible non-limiting control configurations for protection at the input and/or the output of the amplifier (105) during an exemplary signal flow through the high gain path HG shown in FIG. 4A. As previously described, each such protection circuit element may be controlled via a specific control provided by the output, $OUT_{DC}$, of the programmable RF level detector. Such specific control may be via dedicated signal lines of the output, $OUT_{DC}$, or via common signal lines that carry specific control logic. A person skilled in the art is well aware of possible control schemes for controlling the protection circuit elements (110, 125, 225, 260), including related physical and logical designs, details of which are outside the scope of the present application.

Figure 4A:
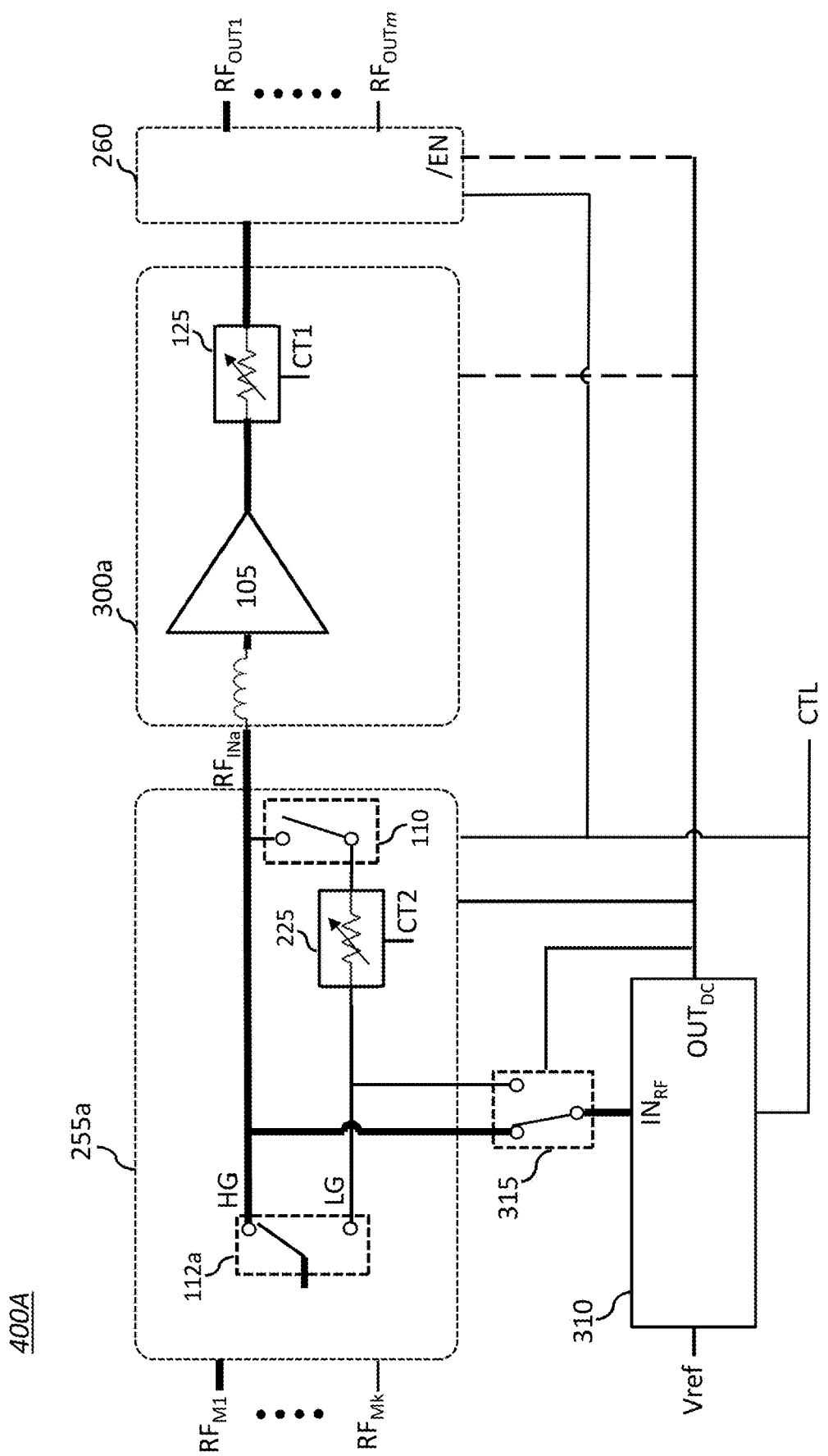
FIG. 4A shows an active RF signal path through the LNA circuit of FIG. 3A according to a mode of operation.

As shown in bold lines in FIG. 4A, during a normal operation wherein a voltage level of an RF signal is below a high voltage level (e.g., below the high trip voltage $V_{HT}$), the RF signal (e.g., $RF_{M1}$ at input of 255a) may flow through an active signal path, in this case the HG path via the input switch (112a), through the amplifier (105), and output at the $RF_{OUT1}$ node of the switch (260). Accordingly, the (input) switch (112a) may couple the input RF signal to the HG path, the switch (110) may decouple the input of the amplifier (105) from the LG path (and attenuator 225), and the attenuator (125) may be programmed for minimal (e.g., reduced) attenuation (e.g., passthrough) of the RF signal processed by the HG path. It should be noted that in contrast to the prior art configuration shown in FIG. 3A wherein the attenuator (125) may be used in combination with the clamp (122) to set a (programmable) clamping voltage level, during normal operation of the attenuator (125) according to the present teachings, such attenuator does not need to provide any level of attenuation and therefore can be programmed to the minimal attenuation supported by the attenuator. As shown in FIG. 4A, during the normal operation, the switch (315) couples the RF signal through the HG path to the RF level detector circuit (310) for monitoring/evaluation/detection of the voltage level of the RF signal. It should be noted that, during the normal operation, an active signal path can include flow of the RF signal through either the HG path (e.g. high gain mode) or the LG path (e.g., low gain mode), wherein the RF level detector circuit (310) monitors the voltage level of the RF signal in each case based on the setting of the switch (315).

Figure 4B:
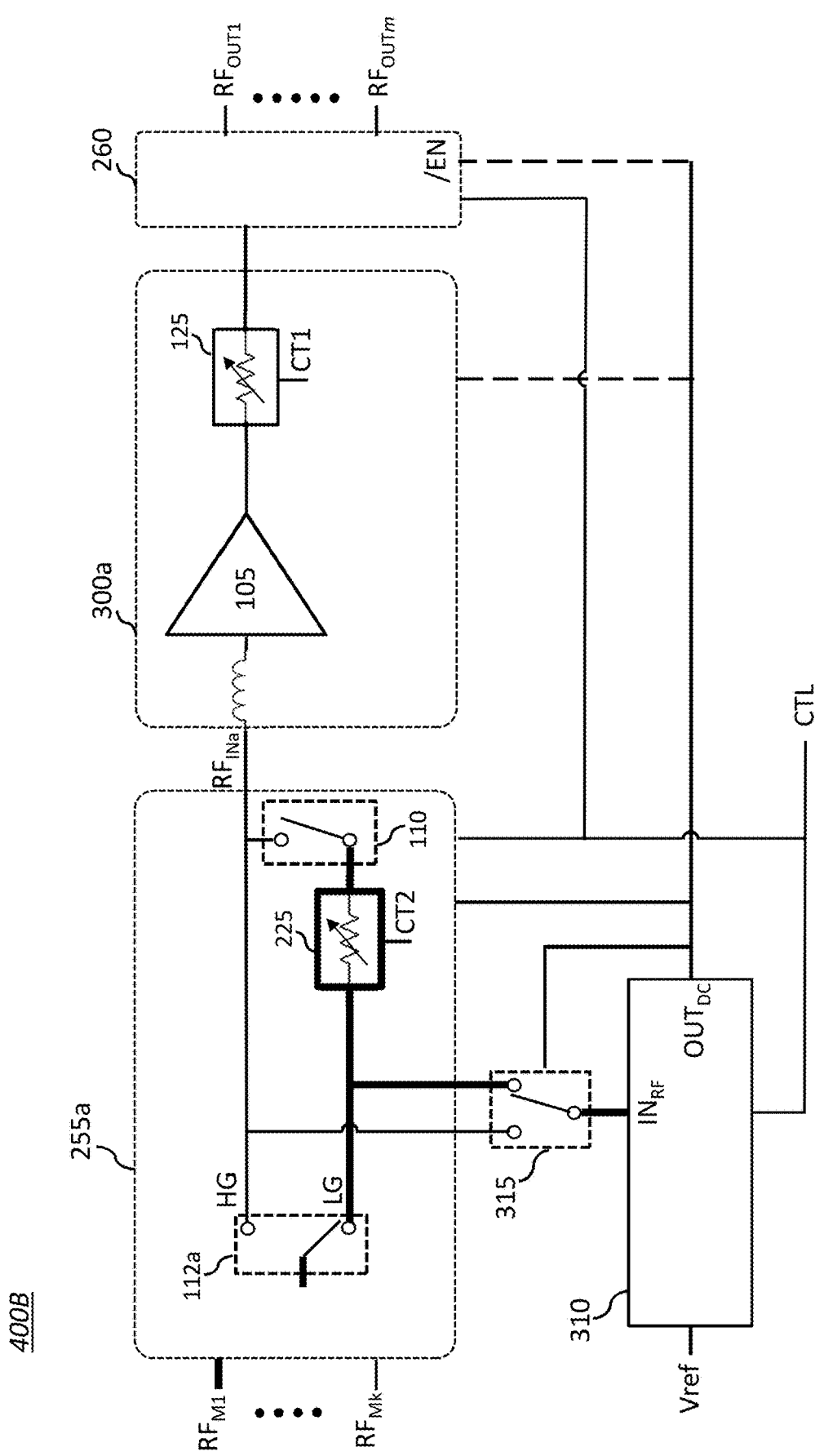
FIG. 4B shows a protection mechanism according to an embodiment of the present disclosure that switches the active RF signal path shown in FIG. 4A to a different RF signal path based on an RF level detected by the programmable RF level detector, the different RF signal path comprising means for attenuating the RF signal before input to the LNA circuit.

FIG. 4B shows a protection mechanism according to an embodiment of the present disclosure wherein the active (RF) signal path, HG path, shown in FIG. 4A is switched to a different RF signal path, the LG path, based on an RF level detected by the programmable RF level detector (310), the different RF signal path, the LG path, comprising means for attenuating (e.g., attenuator 225) the RF signal before input to the LNA circuit (300a) comprising the amplifier (105). Detection of an RF voltage level above the high trip voltage, $V_{HT}$, by the RF level detector circuit (310) may cause such detector to output the $OUT_{DC}$ control signal to: a) force the RF signal to be routed through the LG path that includes the attenuator (225) via for example control of the (input) switch (112a) of the band input switch (255a); and b) control the attenuator (225) to provide a level of attenuation based on for example, configuration data provided to the RF level detector circuit (310) (e.g., via logic circuit block 310D of FIG. 3B), wherein such attenuation is configured to provide a desired level of clamping to the input of the amplifier (105). As shown in FIG. 4B, further increased attenuation may be provided by decoupling the LG path from the input of the amplifier (105) via the switch (110). Furthermore, as shown in FIG. 4B, the switch (315) may be set to couple the input, $IN_{REF}$, of the programmable RF level detector (310) to the LG path where the RF signal flows. Accordingly, the detector (310) can maintain monitoring of the level of the voltage level of the RF signal, and reset the output control, $OUT_{DC}$, to restore the normal operation per the configuration shown in FIG. 4A when an RF voltage level below the low trip voltage, $V_{LT}$, is detected by the RF level detector circuit (310).

Figure 4C:
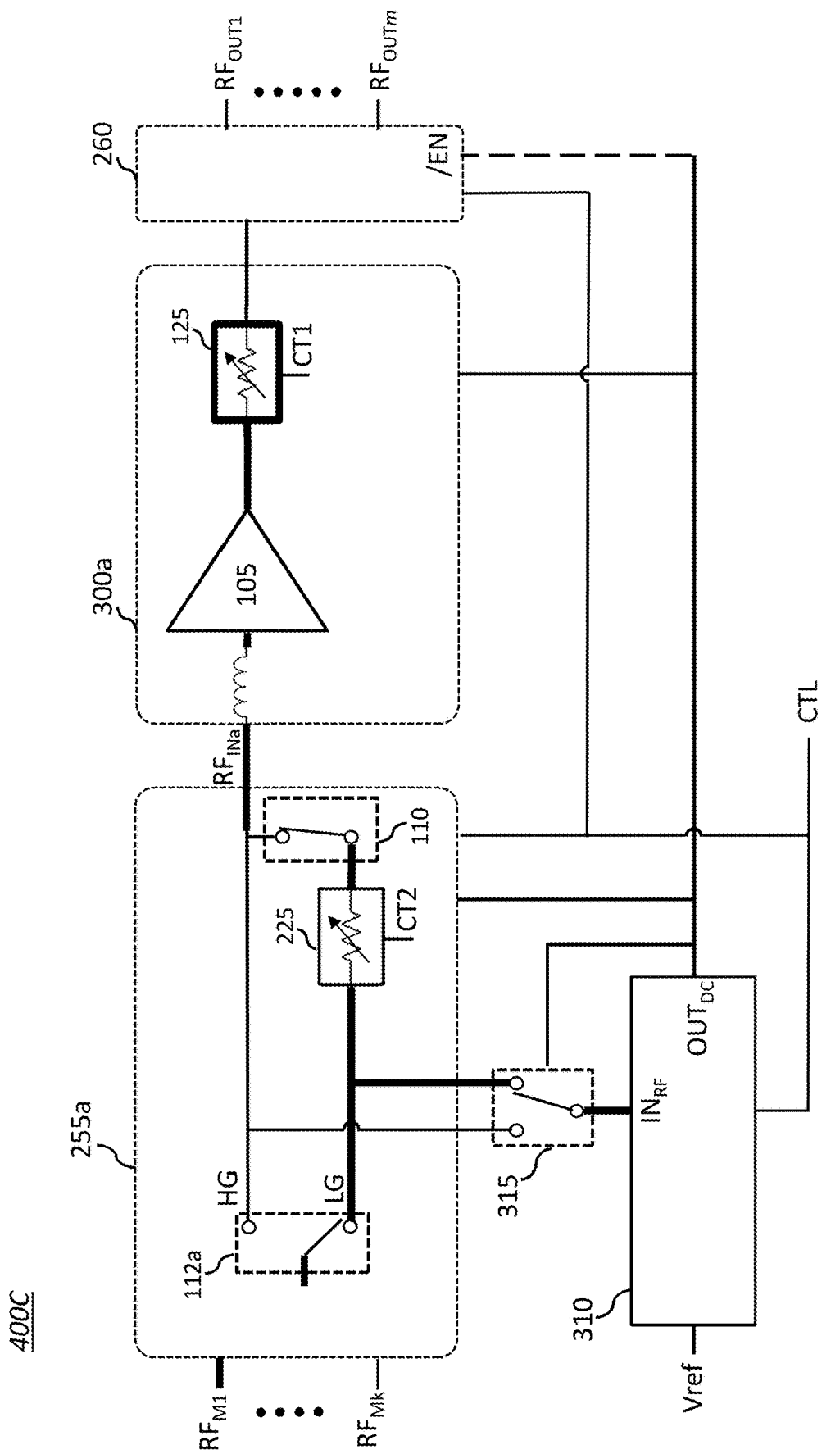
FIG. 4C shows an alternative embodiment according to the present disclosure of the protection mechanism shown in FIG. 4B, wherein the different RF signal path comprises means for attenuating the RF signal at the output of the LNA circuit.

FIG. 4C shows an alternative embodiment according to the present disclosure of the protection mechanism shown in FIG. 4B, wherein the different RF signal path, the LG path, comprises means for attenuating (e.g., attenuator 125) the RF signal at the output of the LNA circuit. In this case, detection of an RF voltage level above the high trip voltage, $V_{HT}$, by the RF level detector circuit (310) may cause such detector to output the $OUT_{DC}$ control signal to: a) force the RF signal to be routed through the LG path that includes the attenuator (225) via for example control of the (input) switch (112a) of the band input switch (255a); and b) control the attenuator (125) to provide a level of attenuation based on for example, configuration data provided to the RF level detector circuit (310) (e.g., via logic circuit block 310D of FIG. 3B), wherein such attenuation is configured to provide a desired level of clamping to the output of the amplifier (105). As shown in FIG. 4C, the attenuator (225) of the LG path may not be controlled based on the RF voltage level detected by the circuit (310) and the switch (110) may be set to couple the RF signal to the amplifier (105). Furthermore, as shown in FIG. 4C, the switch (315) may be set to couple the input, $IN_{RF}$, of the programmable RF level detector (310) to the LG path where the RF signal flows. Accordingly, the detector (310) can maintain monitoring of the level of the voltage level of the RF signal, and reset the output control, $OUT_{DC}$, to restore the normal operation per the configuration shown in FIG. 4A when an RF voltage level below the low trip voltage, $V_{LT}$, is detected by the RF level detector circuit (310).

Figure 4D:
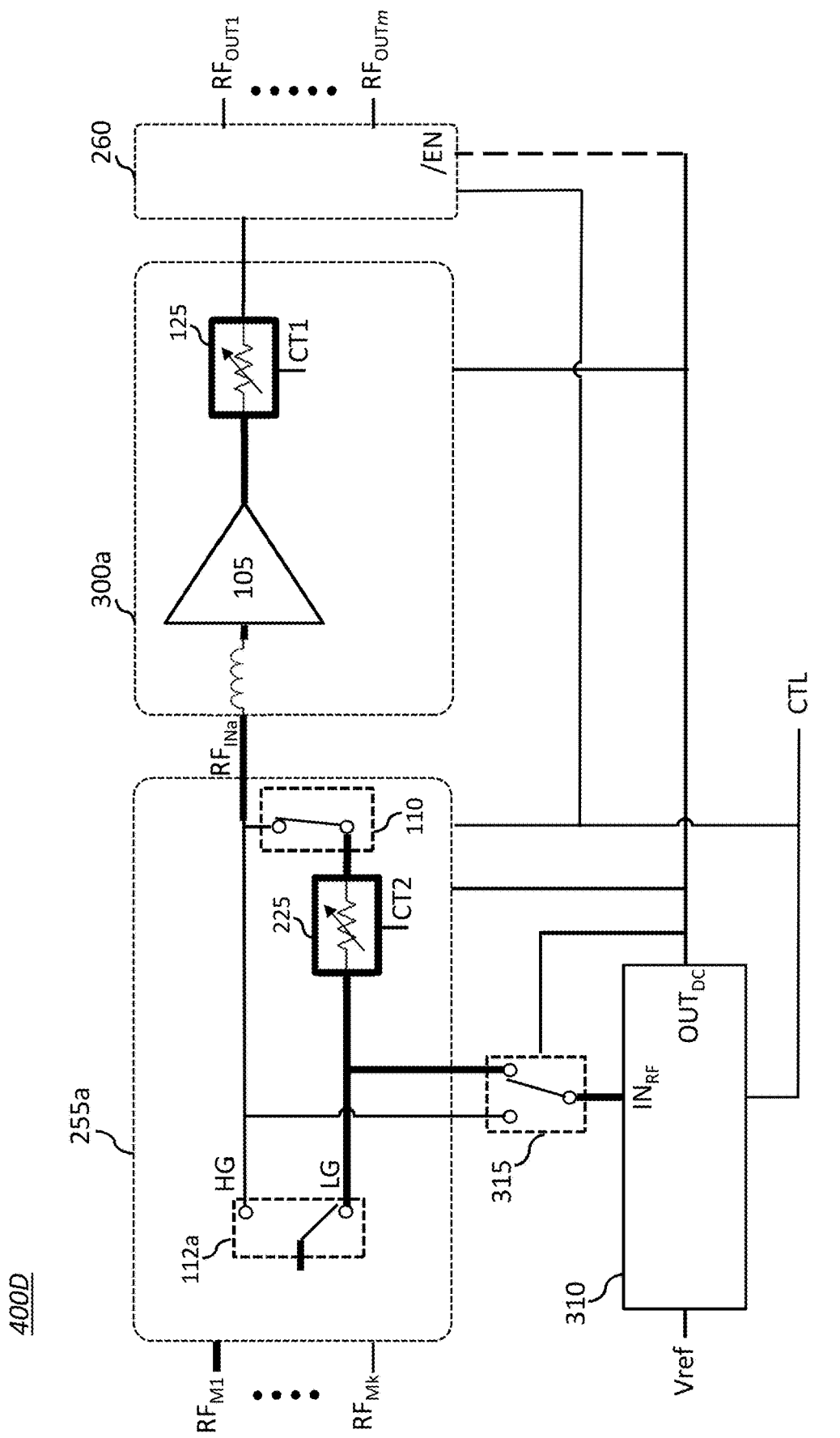
FIG. 4D shows an alternative embodiment according to the present disclosure of the protection mechanism shown in FIG. 4B, wherein the different RF signal path comprises means for attenuating the RF signal at the input and the output of the LNA circuit.

FIG. 4D shows an alternative embodiment according to the present disclosure of the protection mechanism shown in FIG. 4B, wherein the different RF signal path, the LG path, comprises means (e.g., attenuators 125 and 225) for attenuating the RF signal at the input and the output of the LNA circuit. This configuration can be considered as a combination of the configurations shown in FIG. 4B and FIG. 4C. In general, teachings according to the present disclosure provide attenuating (125, 225) and/or isolation (110, 260) means that in combination can be used to protect one or both of the amplifier (105) and downstream active devices/circuits coupled to the output of the amplifier (105). A combination to be used may be different depending on modes of operation and/or integration schemes used. In other words, the exemplary configurations/combinations shown in FIGS. 4A-4G should not be considered as limiting the scope of the present teachings.

Figure 4E:
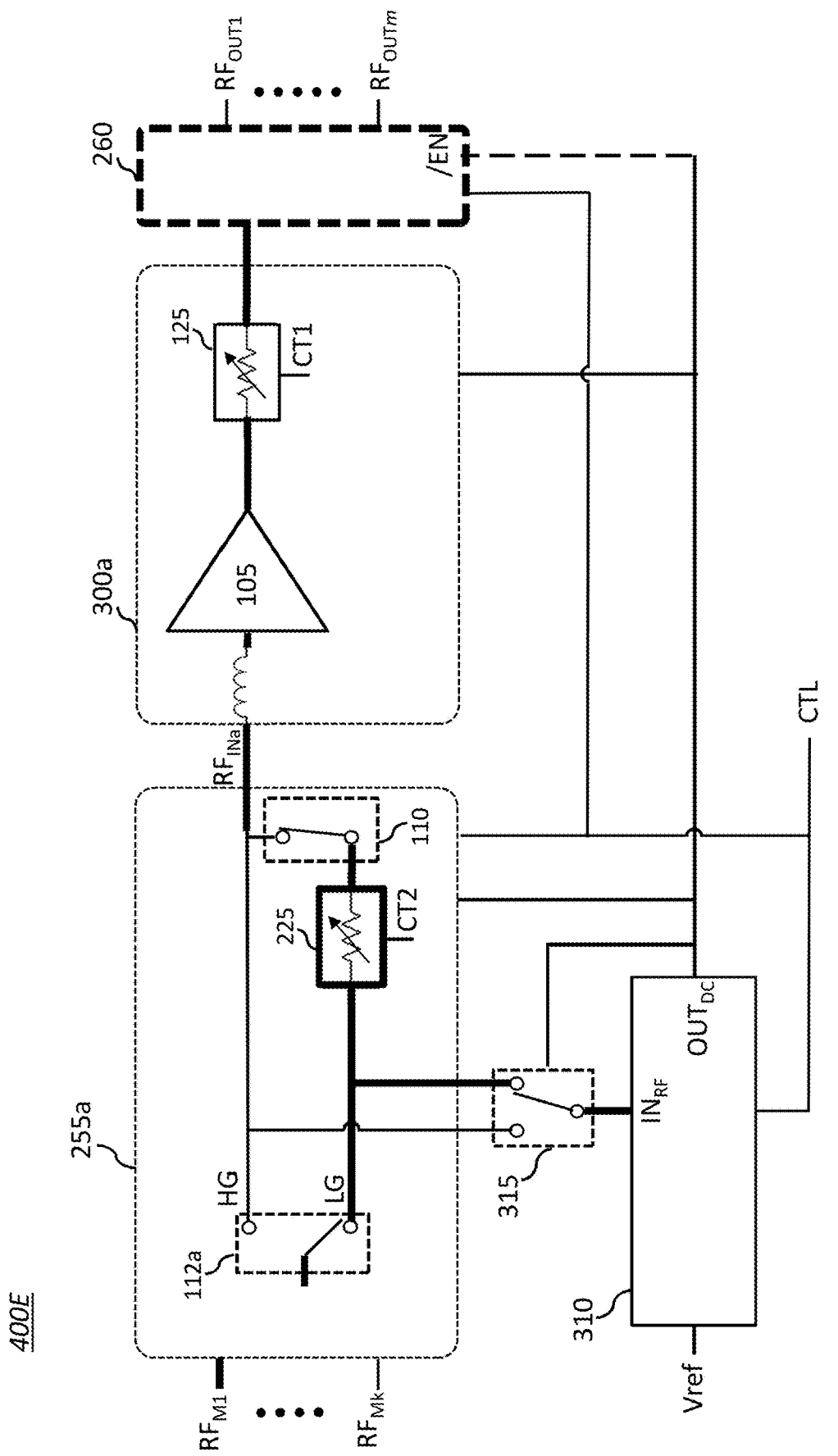
FIG. 4E shows an alternative embodiment according to the present disclosure of the protection mechanism shown in FIG. 4B, wherein the different RF signal path is further isolated from downstream circuits coupled to the output of the LNA circuit via a switch.
Figure 4F:
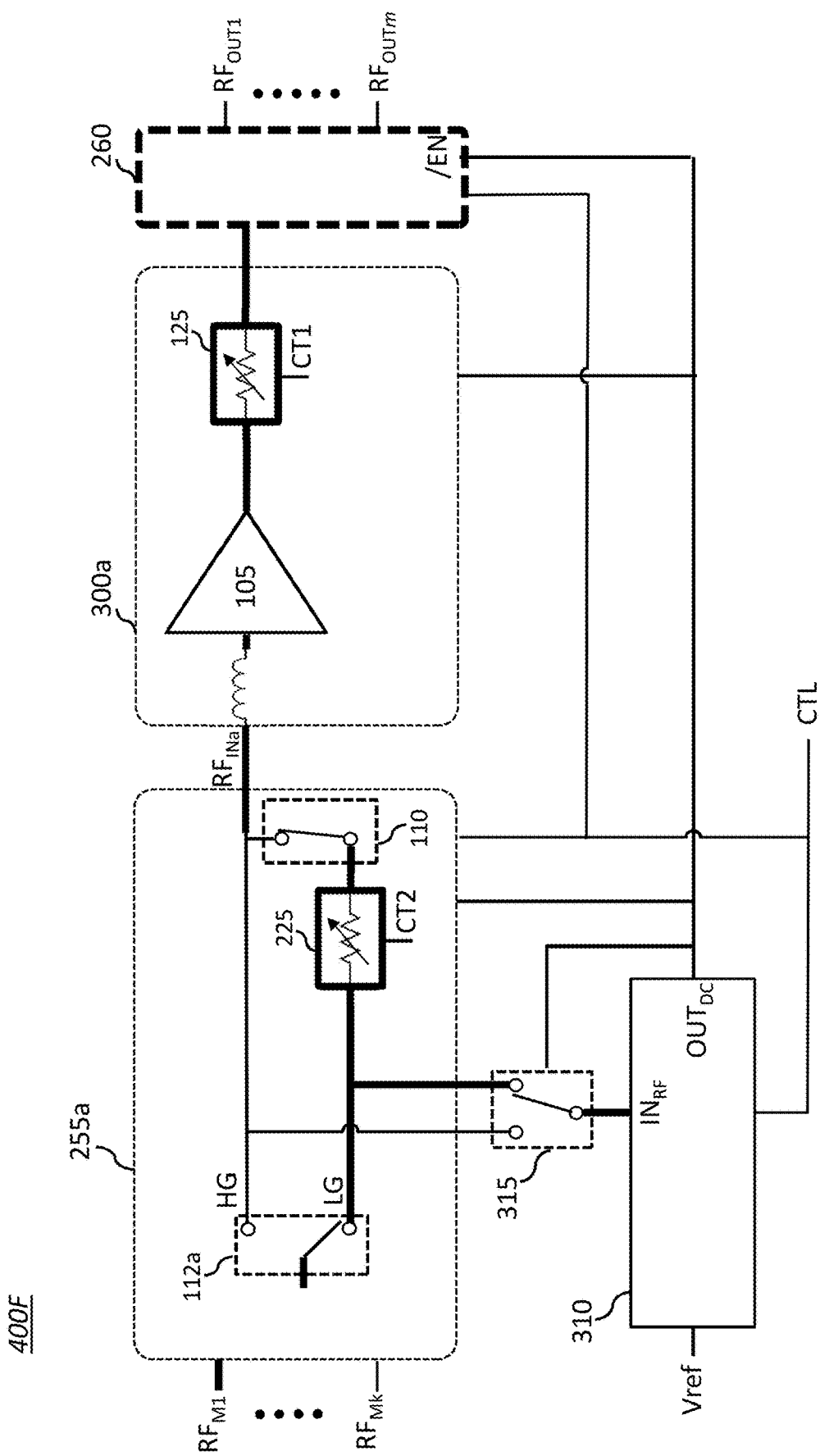
FIG. 4F shows an alternative embodiment according to the present disclosure of the protection mechanism shown in FIG. 4B, wherein the different RF signal path is further isolated from downstream circuits coupled to the output of the LNA circuit via a switch and an attenuator coupled at an output of the LNA circuit.

FIG. 4E shows an alternative embodiment according to the present disclosure of the protection mechanism shown in FIG. 4B, wherein the different RF signal path, the LG path, is further isolated from downstream circuits coupled to the output of the LNA circuit via the switch (260). Although in this exemplary configuration the attenuator (125) is shown as not controlled based on the output $OUT_{DC}$ of the RF level detector circuit (310), according to another exemplary embodiment of the present disclosure, the attenuator (125) may also be controlled, as shown in FIG. 4F. A person skilled in the art would appreciate the teaching according to the present disclosure, wherein elements that are typically used in the switchable RF paths (e.g. LG and HG paths) of an RF front-end stage are reused to operate as protection devices to input and/or outputs of active devices, such as, for example, an amplifier (105) used as an LNA in one or more switchable receive paths of the RF front-end stage.

Although FIG. 4A shows an exemplary mode of operation through the HG path, same configurations shown in FIGS. 4B-4F can be used in a case wherein the mode of operation is through the LG path. A person skilled in the art would understand that in such case, during normal operation wherein the voltage level of the RF signal is below the high trip voltage $V_{HT}$, the attenuator (225) may be programmed to provide an attenuation according to a (low) gain mode of operation, and programmed for an attenuation based on a desired level of clamping when a voltage level of the RF signal is above the high trip voltage $V_{HT}$.

Figure 4G:
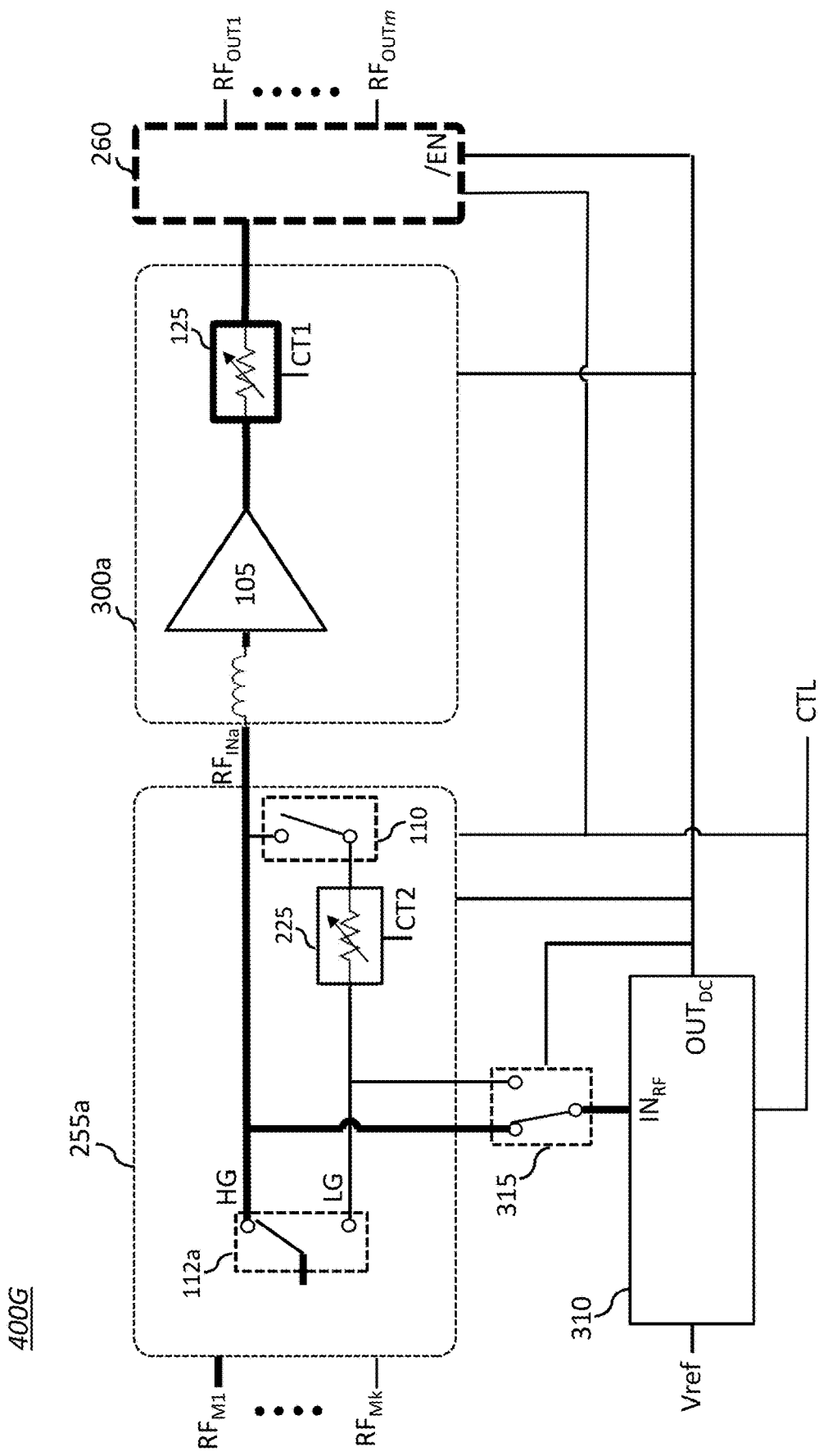
FIG. 4G shows a protection mechanism according to an embodiment of the present disclosure that activates an attenuator and/or a switch coupled to an RF signal path based on an RF level detected by the programmable RF level detector.

Finally, as shown in FIG. 4G, according to an exemplary embodiment of the present disclosure, the active (RF) signal path, HG path shown in FIG. 4A, may be maintained and not switched as described in the embodiments with reference to FIGS. 4B-4F. Instead, as shown in FIG. 4G, upon detection of high value of the RF level, either one or both the attenuator (125) and the output switch (260) can be used to protect downstream circuit coupled to the output of the amplifier (105). For example, for a detected RF level between the reference high trip voltage $V_{HT}$ and a reference low trip voltage $V_{LT}$, the attenuator (125) can be controlled for a higher attenuation level, and for a detected RF level higher than the reference high trip voltage $V_{HT}$, the output switch (260) can be controlled to isolate (decouple) the output of the amplifier (105) from the downstream circuit.

Figure 5:
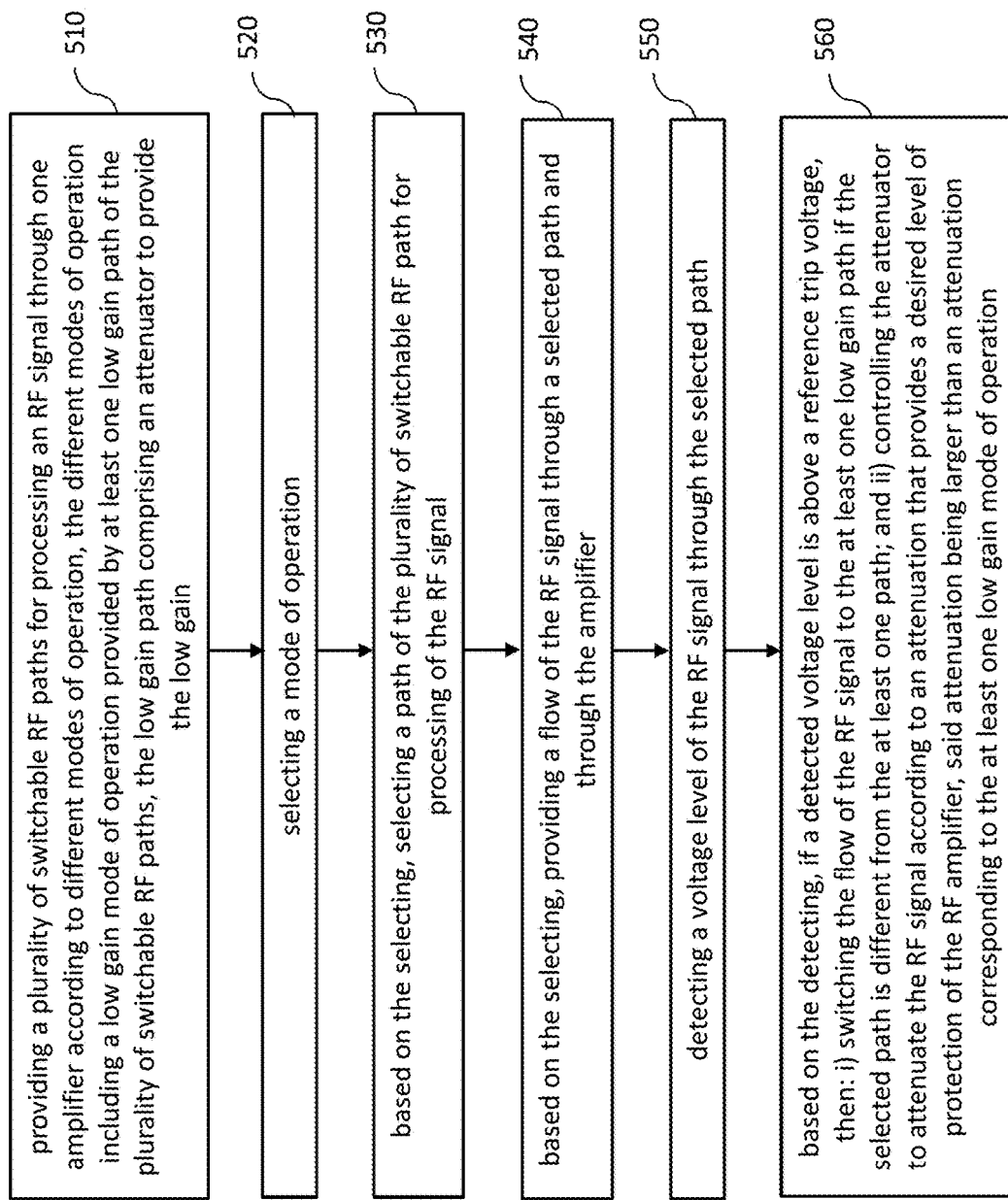
FIG. 5 is a process chart showing various steps of a method according to an embodiment of the present disclosure for protecting an amplifier from higher voltage.

FIG. 5 is a process chart (500) showing various steps of a method for protecting an amplifier from higher voltage. As can be seen in the process chart (500) such steps includes: providing a plurality of switchable RF paths for processing an RF signal through one amplifier according to different modes of operation, the different modes of operation including a low gain mode of operation provided by at least one low gain path of the plurality of switchable RF paths, the low gain path comprising an attenuator to provide the low gain, per step (510); selecting a mode of operation, per step (520); based on the selecting, selecting a path of the plurality of switchable RF path for processing of the RF signal, per step (530); based on the selecting, providing a flow of the RF signal through a selected path and through the amplifier, per step (540); detecting a voltage level of the RF signal through the selected path, per step (550); and based on the detecting, if a detected voltage level is above a reference trip voltage, then: i) switching the flow of the RF signal to the at least one low gain path if the selected path is different from the at least one path; and ii) controlling the attenuator to attenuate the RF signal according to an attenuation that provides a desired level of protection of the RF amplifier, said attenuation being larger than an attenuation corresponding to the at least one low gain mode of operation, per step (560).

It should be noted that the various embodiments of the ruggedness protection circuit according to the present disclosure, may be implemented as a monolithically integrated circuit (IC) according to any fabrication technology and process known to a person skilled in the art.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functions without significantly altering the functionality of the disclosed circuits.

The examples set forth above are provided to give those of ordinary skill in the art a complete disclosure and description of how to make and use the embodiments of the gate drivers for stacked transistor amplifiers of the disclosure, and are not intended to limit the scope of what the applicant considers to be the invention. Such embodiments may be, for example, used within mobile handsets for current communication systems (e.g. WCMDA, LTE, WiFi, etc.) wherein amplification of signals with frequency content of above 100 MHz and at power levels of above 50 mW may be required. The skilled person may find other suitable implementations of the presented embodiments.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

The invention claimed is:

1. A circuital arrangement comprising:
a plurality of switchable RF paths comprising an RF amplifier and one or more switches configured to selectively provide a path of the plurality of switchable RF paths for flow of an RF signal provided at an input of the plurality of switchable RF paths to an output of the plurality of switchable RF paths through the RF amplifier;
an RF level detector circuit that is selectively coupled via a first switch to the plurality of switchable RF paths,
wherein the plurality of switchable RF paths comprises at least one path comprising a first attenuator, the at least one path configured to provide at least one low gain mode of operation of the circuital arrangement through the at least one path, and
wherein the RF level detector circuit is configured to detect a voltage level of the RF signal through a selected path of the plurality of switchable RF paths that provides the flow of the RF signal, and if a corresponding detected voltage level is above a reference trip voltage, the RF level detector circuit is configured to generate a control signal to:

i) switch the flow of the RF signal from the selected path to the at least one path if the selected path is different from the at least one path, and
ii) control the first attenuator to attenuate the RF signal according to an attenuation that provides a desired level of protection of the RF amplifier, said attenuation being different from an attenuation corresponding to the at least one low gain mode of operation.

2. The circuital arrangement according to claim 1, wherein:
the first attenuator is coupled to an input of the RF amplifier via a second switch.

3. The circuital arrangement according to claim 2, wherein:
the control signal further controls the second switch to decouple the first attenuator from the input of the RF amplifier.

4. The circuital arrangement according to claim 1, wherein:
the first attenuator is coupled to an output of the RF amplifier and is shared amongst the plurality of switchable RF paths.

5. The circuital arrangement according to claim 2, wherein:
the plurality of switchable RF paths further comprise a second attenuator coupled to an output of the RF amplifier, the second attenuator shared amongst the plurality of switchable RF paths and configured to provide a reduced attenuation of the RF signal through the selected path, and
the control signal further controls the second attenuator to attenuate the RF signal according to an attenuation that provides a desired level of protection at the output of the RF amplifier, said attenuation being larger than the reduced attenuation.

6. The circuital arrangement according to claim 1, wherein:
the first switch is configured to selectively couple the RF signal to an input of the RF level detector circuit based on the flow of the RF signal through one of: a) the selected path, and b) the at least one path.

7. The circuital arrangement according to claim 1, wherein:
the circuital arrangement further comprises an output switch coupled to the output of the plurality of switchable RF paths, the output switch configured to selectively couple said output to downstream circuits, and
the control signal further controls the output switch to decouple the output of the plurality of switchable RF paths from the downstream circuits.

8. The circuital arrangement according to claim 1, wherein:
the circuital arrangement further comprises an input switch that is configured to selectively couple the RF signal from a plurality of RF signals to the selected path based on a mode of operation of the circuital arrangement, and
the control signal further controls the input switch to switch the flow of the RF signal from the selected path to the at least one path if the selected path is different from the at least one path.

9. The circuital arrangement according to claim 1, wherein:
the at least one path is configured to provide two or more low gain modes of operation based on different attenuations provided by the first attenuator.

10. The circuital arrangement according to claim 1, wherein the RF amplifier comprises a plurality of metal-oxide-semiconductor (MOS) field effect transistors (FETs).

11. The circuital arrangement according to claim 10, wherein said transistors are fabricated using one of: a) silicon-on-insulator (SOI) technology, b) silicon-on-sapphire (SOS) technology, and c) bulk silicon (Si) technology.

12. The circuital arrangement according to claim 1, wherein circuital arrangement is monolithically integrated.

13. An electronic module comprising the circuital arrangement of claim 1.

14. The electronic module of claim 13, wherein the electronic module is a low noise amplifier (LNA) module that supports operation according to a plurality of different gain modes and different bands.

15. A radio frequency (RF) front-end communication system, comprising:
a receiver section for receiving an RF signal according to different modes of operation, the receiver section comprising the circuital arrangement of claim 1.

16. A method for protecting an amplifier from higher voltage, the method comprising:
providing a plurality of switchable RF paths for processing an RF signal through one amplifier according to different modes of operation, the different modes of operation including a low gain mode of operation provided by at least one low gain path of the plurality of switchable RF paths, the low gain path comprising an attenuator to provide the low gain;
selecting a mode of operation;
based on the selecting, selecting a path of the plurality of switchable RF path for processing of the RF signal;
based on the selecting, providing a flow of the RF signal through a selected path and through the amplifier;
detecting a voltage level of the RF signal through the selected path; and
based on the detecting, if a detected voltage level is above a reference trip voltage, then:
i) switching the flow of the RF signal to the at least one low gain path if the selected path is different from the at least one path; and
ii) controlling the attenuator to attenuate the RF signal according to an attenuation that provides a desired level of protection of the RF amplifier, said attenuation being larger than an attenuation corresponding to the at least one low gain mode of operation.

17. A circuital arrangement comprising:
a plurality of switchable RF paths comprising an RF amplifier and one or more switches configured to selectively provide a path of the plurality of switchable RF paths for flow of an RF signal provided at an input of the plurality of switchable RF paths to an output of the plurality of switchable RF paths through the RF amplifier;
an RF level detector circuit that is selectively coupled via a first switch to the plurality of switchable RF paths, wherein the plurality of switchable RF paths comprises at least one path comprising a first attenuator, and
wherein the RF level detector circuit is configured to detect a voltage level of the RF signal through the at least one path when selected, and if a corresponding detected voltage level is above a reference trip voltage, the RF level detector circuit is configured to generate a control signal to:
control the first attenuator to attenuate the RF signal according to an attenuation that provides a desired level of protection of downstream circuits coupled to said at least one path, said attenuation being larger than different from an attenuation corresponding to a normal mode of operation of said at least one path.

18. The circuital arrangement according to claim 17, wherein:
the circuital arrangement further comprises an output switch coupled to the output of the plurality of switchable RF paths, the output switch configured to selectively couple the output of the plurality of switchable RF paths to downstream circuits, and
the reference trip voltage is a low trip voltage and if the corresponding detected voltage level is above a reference high trip voltage that is greater than the reference low trip voltage, the RF level detector circuit generates the control signal to control the output switch to decouple the output of the plurality of switchable RF paths from the downstream circuits.

19. The circuital arrangement according to claim 17, wherein the first attenuator is shared amongst a group of the plurality of switchable RF paths.

20. The circuital arrangement according to claim 19, wherein the first attenuator is coupled to an output of the amplifier.

* * * * *